(12) United States Patent
Lee

(10) Patent No.: US 10,483,196 B2
(45) Date of Patent: Nov. 19, 2019

(54) EMBEDDED TRACE SUBSTRATE STRUCTURE AND SEMICONDUCTOR PACKAGE STRUCTURE INCLUDING THE SAME

(71) Applicant: Advanced Semiconductor Engineering, Inc., Kaohsiung (TW)

(72) Inventor: Yu-Ying Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/887,780

(22) Filed: Feb. 2, 2018

(65) Prior Publication Data

US 2018/0240745 A1   Aug. 23, 2018

Related U.S. Application Data

(60) Provisional application No. 62/462,248, filed on Feb. 22, 2017.

(51) Int. Cl.
*H01L 23/00* (2006.01)
*H01L 23/498* (2006.01)
(Continued)

(52) U.S. Cl.
CPC .... *H01L 23/49838* (2013.01); *H01L 21/4853* (2013.01); *H01L 21/565* (2013.01); *H01L 21/6835* (2013.01); *H01L 23/3114* (2013.01); *H01L 24/16* (2013.01); *H01L 23/3128* (2013.01); *H01L 24/13* (2013.01); *H01L 2221/68345* (2013.01); *H01L 2221/68372* (2013.01); *H01L 2224/0401* (2013.01); *H01L 2224/05124* (2013.01); *H01L 2224/05147* (2013.01); *H01L 2224/05572* (2013.01); *H01L 2224/05573* (2013.01); *H01L 2224/05624* (2013.01); *H01L 2224/05647* (2013.01); *H01L 2224/05666* (2013.01); *H01L 2224/13007* (2013.01); *H01L 2224/13082* (2013.01); *H01L 2224/13111* (2013.01); *H01L 2224/13147* (2013.01); *H01L 2224/16227* (2013.01);
(Continued)

(58) Field of Classification Search
CPC .......... H01L 23/49838; H01L 21/6835; H01L 24/16; H01L 23/3114; H01L 21/4853; H01L 21/565; H01L 2924/01029; H01L 2224/16227; H01L 2224/16503; H01L 2924/0105; H01L 2221/68372
See application file for complete search history.

(56) References Cited

U.S. PATENT DOCUMENTS

2013/0234318 A1* 9/2013 Lee .............. H01L 24/81 257/737
2018/0005846 A1* 1/2018 Tsai ............... H01L 21/4857

FOREIGN PATENT DOCUMENTS

JP     3894162 B2   3/2007

* cited by examiner

*Primary Examiner* — Selim U Ahmed
(74) *Attorney, Agent, or Firm* — Foley & Lardner LLP; Cliff Z. Liu

(57) ABSTRACT

A substrate structure includes a carrier, a first metal layer, a circuit layer and a dielectric layer. The carrier has a first surface and a second surface. The first metal layer is disposed on the first surface of the carrier. The circuit layer is disposed on the first metal layer. The dielectric layer covers the circuit layer and defines a plurality of openings to expose portions of the circuit layer and portions of the first metal layer.

18 Claims, 11 Drawing Sheets

(51) Int. Cl.
*H01L 23/31* (2006.01)
*H01L 21/48* (2006.01)
*H01L 21/56* (2006.01)
*H01L 21/683* (2006.01)

(52) U.S. Cl.
CPC ............... *H01L 2224/16237* (2013.01); *H01L 2224/16503* (2013.01); *H01L 2224/32225* (2013.01); *H01L 2224/73204* (2013.01); *H01L 2224/81005* (2013.01); *H01L 2224/8181* (2013.01); *H01L 2224/81447* (2013.01); *H01L 2224/92125* (2013.01); *H01L 2224/97* (2013.01); *H01L 2924/0105* (2013.01); *H01L 2924/01029* (2013.01); *H01L 2924/15311* (2013.01); *H01L 2924/15313* (2013.01)

EMBEDDED TRACE SUBSTRATE STRUCTURE AND SEMICONDUCTOR PACKAGE STRUCTURE INCLUDING THE SAME

CROSS-REFERENCE TO RELATED APPLICATIONS

This application claims the benefit of and priority to U.S. Provisional Patent Application 62/462,248, filed on Feb. 22, 2017, which is incorporated herein by reference in its entirety.

BACKGROUND

1. Field of the Disclosure

The present disclosure relates to a substrate structure, a semiconductor package structure and a manufacturing method, and to an embedded trace substrate (ETS) structure, a semiconductor package structure including the ETS structure, and a method for manufacturing the semiconductor package structure.

2. Description of the Related Art

Some semiconductor device packages include an ETS, such as a substrate in which a trace is embedded, wherein a portion of the trace is exposed from the substrate. In some such packages, it may desirable to use the trace as solder ball (or solder bump) land pads. However, in some cases use of a thin trace (e.g. having a thickness of less than about 20 micrometers (μm)) in such a package may lead to solder bump land pad deformation during or subsequent to a molding process. This can make it difficult to minimize a size of the package, which can be desirable in some cases.

SUMMARY

In some embodiments, according to an aspect, a substrate structure includes a carrier, a first metal layer, a circuit layer and a dielectric layer. The carrier has a first surface and a second surface. The first metal layer is disposed on the first surface of the carrier. The circuit layer is disposed on the first metal layer. The dielectric layer covers the circuit layer and defines a plurality of openings to expose portions of the circuit layer and portions of the first metal layer.

In some embodiments, according to another aspect, a semiconductor package structure includes a circuit layer, a dielectric layer, a semiconductor die and a connecting element. The dielectric layer covers a first surface of the circuit layer and has a first surface and a second surface. The dielectric layer defines an opening to expose a portion of the circuit layer, and the opening extends through the dielectric layer. The semiconductor die is attached to the circuit layer by flip chip bonding. The connecting element electrically connects the semiconductor die and the circuit layer. At least a portion of the connecting element is disposed in the opening of the dielectric layer and is exposed from the second surface of the dielectric layer.

In some embodiments, according to another aspect, a semiconductor package structure includes a circuit layer, a dielectric layer, a semiconductor die and a plurality of connecting elements. The dielectric layer covers a first surface of the circuit layer and defines a plurality of openings to expose portions of the circuit layer. The semiconductor die is attached to the circuit layer by flip chip bonding. The connecting elements electrically connect the semiconductor die and the portions of the circuit layer exposed by the openings. At least a portion of each of the connecting elements is respectively disposed in the openings of the dielectric layer, and is exposed from a surface of the dielectric layer. Shapes of the exposed portions of the connecting elements are respectively defined by the openings of the dielectric layer.

In some embodiments, according to another aspect, a method for manufacturing a semiconductor package structure includes: (a) providing a substrate structure, wherein the substrate structure comprises a carrier, a metal layer, a circuit layer and a dielectric layer, wherein the carrier has a first surface and a second surface, the metal layer is disposed on the first surface of the carrier, the circuit layer is disposed on the metal layer, and the dielectric layer covers the circuit layer and defines a plurality of openings to expose portions of the circuit layer and portions of the metal layer; and (b) attaching a semiconductor die to the substrate structure by flip chip bonding through a plurality of connecting elements, wherein the connecting elements are respectively disposed on the exposed portions of the circuit layer and the exposed portions of the metal layer, in the openings of the dielectric layer.

BRIEF DESCRIPTION OF THE DRAWINGS

Characteristics of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
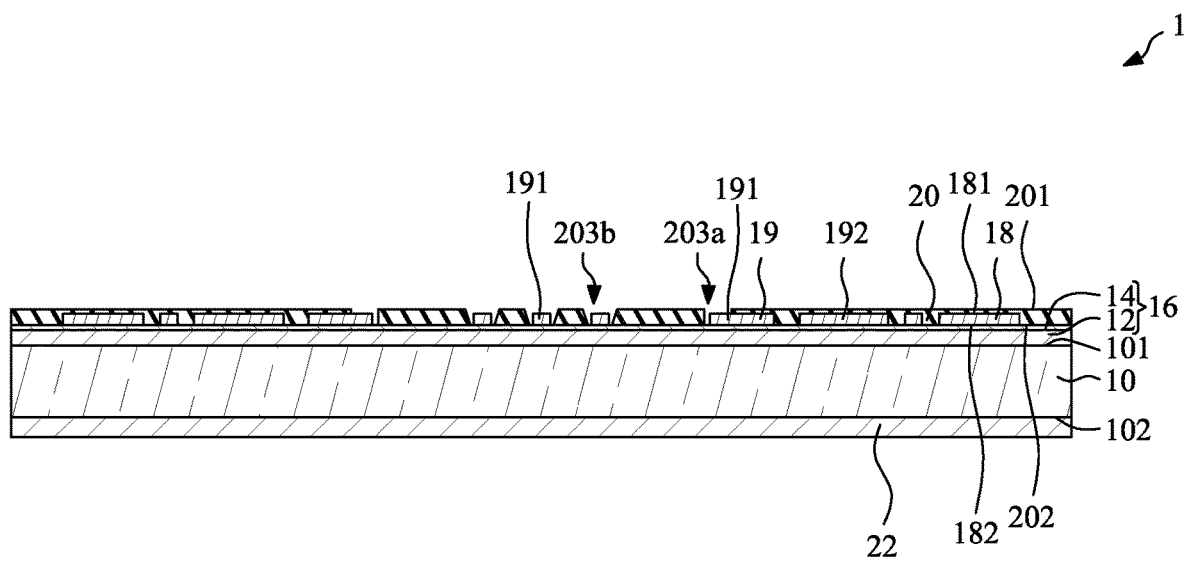
FIG. 1 illustrates a cross-sectional view of some embodiments of a substrate structure according to an aspect of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a substrate structure including a circuit layer disposed on a first metal layer and a dielectric layer defining a plurality of openings to expose portions of the circuit layer and portions of the first metal layer. At least some embodiments of the present disclosure further disclose a semiconductor package structure including a plurality of connecting elements electrically connecting a semiconductor die and a circuit layer, wherein at least a portion of the connecting element is disposed in an opening of a dielectric layer and is exposed from a surface of the dielectric layer. At least some embodiments of the present disclosure further disclose techniques for manufacturing the semiconductor package structure.

In a comparative ETS structure, a single circuit layer (including at least one trace) is embedded in a single dielectric layer. Portions of an upper surface of the circuit layer are exposed from an upper surface of the dielectric layer and can serve as die pads on which a semiconductor die is attached. It is noted that a width of each of the die pads may be greater than a width of the trace. The dielectric layer defines a plurality of openings to expose portions of a lower surface of the circuit layer from a lower surface of the dielectric layer. The exposed portions of the circuit layer can serve as solder ball (or solder bump) land pads on which solder balls (or solder bumps) are attached. It is noted that a width of each of the solder bump land pads may be greater than a width of the trace, and the upper surface of each of the solder bump land pads is also exposed from the upper surface of the dielectric layer.

In a process for manufacturing a semiconductor package structure including such an ETS structure, the ETS structure is attached to a carrier such that the lower surface of the dielectric layer contacts the carrier, and an empty space is defined by the opening of the dielectric layer, the solder bump land pad and the carrier. Then, the semiconductor die is attached to the die pads. The semiconductor die includes a plurality of conductive pillars on an active surface of the semiconductor die. A plurality of connecting elements (e.g., solder bumps) are used to connect the conductive pillar and the die pad. Then, a molding compound is applied to cover the semiconductor die, the conductive pillars, the connecting elements and the carrier. Then, the carrier is removed so as to obtain the semiconductor package structure. Then, a plurality of solder balls (or solder bumps) are used to connect the solder bump land pads to a printed circuit board (PCB).

Before the molding operation, the above-mentioned empty space is defined. That is, the upper surface and lower surface of the solder bump land pad are empty. Therefore, during the molding operation, molding compound may flow to press the upper surface of the solder bump land pad. If the solder bump land pad is too thin (e.g. having a thickness of less than about 20 µm), it may deform easily. In addition, after the molding operation, the molding compound is cured. The curing process of the molding compound may further deform the solder bump land pad. In order to increase the structure rigidity of the circuit layer to sustain the pressure of molding flow during the molding operation and the bending force during the curing process, the circuit layer may be designed to have a thickness of greater than 20 µm. As a result, a line width and a line space (L/S) of the circuit layer may be equal to or greater than 12 µm/12 µm. This can make it difficult to minimize a size of the semiconductor package structure.

In addition, the upper surface of the circuit layer may be exposed from the upper surface of the dielectric layer, thus, the connecting elements may bleed and contact an adjacent die pad or trace of the circuit layer, which can result in a bridge and a short circuit. To avoid this, the adjacent die pads or traces of the circuit layer can be disposed far apart. This may lead to the L/S of the circuit layer being large. In order to avoid such a bridge and short circuit, a protection layer (e.g., a solder resist layer) may be formed or disposed on the upper surface of the dielectric layer to cover the upper surface of the circuit layer. The protection layer defines a plurality of openings to expose the die pad of the circuit layer. It is noted that an area of the opening from a top view may be greater than an area of the die pad from a top view so that the die pad is largely (e.g. completely) exposed. However, since manufacture of the protection layer may be done with a large resolution, and a manufacturing tolerance may be large, the area of the opening of the protection layer may be much greater than the area of the die pad of the circuit layer. For example, the size of the opening of the protection layer may be about 80 μm*about 110 μm. Therefore, the trace of the circuit layer may be spaced far from the die pad of the circuit layer (e.g. to ensure that it is covered by the protection layer and not exposed by the opening of the protection layer). This may result in a large L/S of the circuit layer.

To address at least these issues, some embodiments of this disclosure are directed to semiconductor package structures and methods of manufacturing semiconductor package structures that include an extended intermetallic compound (IMC) layer. Rather than, or in addition to, using an ETS to provide land pads (e.g. connection points for solder bumps, vias, or other electrical or metallic connectors), a foil, such as a metallic foil that includes a metal (e.g. copper (Cu)) may be disposed in or on a substrate (such as on a thin Cu layer of the substrate) during a manufacturing process, a portion of the foil being exposed. A land pad or die pad (which may include a same or a different metal than is included in the foil) may be disposed on the foil, leaving a portion of the foil adjacent to the land pad (or die pad) exposed. In a manufacturing process, solder may be deposited on the land pad (or die pad) and on the adjacent portion of the foil. The solder may wet both the land pad (or die pad) and the foil. This may lead to the formation of an IMC layer on both the land pad (or die pad) and on the foil—that is, the IMC layer may extend to the foil. The extended IMC may help to structurally and/or mechanically strengthen the connection between the land pad (or die pad) and the solder, and may allow for a better electrical connection at a solder joint (e.g. may lower on-site electrical resistance at the solder joint).

The present disclosure addresses at least the above concerns and provides an improved substrate structure and semiconductor package structure, and improved techniques for manufacturing the semiconductor package structure. In the manufacturing process of the semiconductor package structure, a circuit layer is formed on a first metal layer of a carrier so that a solder bump land pad is supported by the first metal layer during a molding operation and will not deform.

FIG. 1 illustrates a cross-sectional view of some embodiments of a substrate structure 1 according to an aspect of the present disclosure. The substrate structure 1 may be an ETS that includes a carrier 10, a first metal layer 16, a circuit layer 18, a dielectric layer 20 and a second metal layer 22. The carrier 10 may include, for example, a metal material, a ceramic material, a glass material, a dielectric material or a semiconductor wafer. The shape of the carrier 10 may be, for example, substantially rectangular or square. Alternatively, the shape of the carrier 10 may be, for example, substantially circular or elliptical. The carrier 10 has a first surface 101 and a second surface 102 opposite to the first surface 101.

The first metal layer 16 is disposed on the first surface 101 of the carrier 10. In the embodiments illustrated in FIG. 1, the first metal layer 16 may include a base metal layer 12 and a conductive metal layer 14. The base metal layer 12 is disposed on the first surface 101 of the carrier 10, and the conductive metal layer 14 is disposed on the base metal layer 12. In some embodiments, the base metal layer 12 may be a copper foil pressed on or adhered to the carrier 10, and the conductive metal layer 14 may also be a copper foil adhered to the base metal layer 12. In some embodiments, a thickness of the base metal layer 12 may differ from a thickness of the conductive metal layer 14. The thickness of the base metal layer 12 may be in a range of about four to about six times as large as the thickness of the conductive metal layer 14. For example, the thickness of the base metal layer 12 may be about 18 μm, and the thickness of the conductive metal layer 14 may be about 3 μm.

The circuit layer 18 is disposed on the first metal layer 16. In some embodiments, the circuit layer 18 is disposed on the conductive metal layer 14 of the first metal layer 16. In some embodiments, the circuit layer 18 may be a patterned circuit layer, and may be formed by plating. The circuit layer 18 may include at least one trace 19, at least one die pad 191 and at least one solder bump land pad 192. The circuit layer 18 has a first surface 181 and a second surface 182 opposite to the first surface 181. The second surface 182 of the circuit layer 18 contacts the conductive metal layer 14 of the first metal layer 16 directly. In some embodiments, a thickness of the circuit layer 18 is in a range of about 10 μm to about 15 μm, and a line width and a line space (L/S) of the circuit layer 18 is in a range of about 5 μm/about 5 μm to about 12 μm/about 12 μm.

The dielectric layer 20 covers the circuit layer 18 and the conductive metal layer 14 of the first metal layer 16. The dielectric layer 20 may include, or be formed from, a photoresist layer, a cured photosensitive material, a cured photoimageable dielectric (PID) material such as a polyamide (PA), a polyimide (PI), an epoxy or polybenzoxazole (PBO), or a combination of two or more thereof. The dielectric layer 20 has a first surface 201 and a second surface 202 opposite to the first surface 201. A thickness of the dielectric layer 20 is greater than a thickness of the circuit layer 18 (e.g. by a ratio of about 1.3 or more, about 1.5 or more, or about 1.7 or more), so that the second surface 202 of the dielectric layer 20 is substantially coplanar with the second surface 182 of the circuit layer 18, and the first surface 201 of the dielectric layer 20 is higher than (and, for example, covers at least a portion of) the first surface 181 of the circuit layer 18. The dielectric layer 20 defines a plurality of openings (including, for example, a plurality of first openings 203a and a plurality of second openings 203b) to expose portions (e.g., the die pads 191) of the circuit layer 18 and portions of the conductive metal layer 14 of the first metal layer 16. In some embodiments, a shape of a cross section of the first opening 203a is different from a shape of a cross section of the second opening 203b. For example, an inclination angle between the first surface 201 of the dielectric layer 20 and a side wall of the first opening 203a may be substantially equal to 90 degrees, and an inclination angle between the first surface 201 of the dielectric layer 20 and a side wall of the second opening 203b may be greater than about 90 degrees (e.g. may be in a range from about 91 degrees to about 135 degrees). In one or more embodiments, this is because the first opening 203a is formed by exposure and development, and the second opening 203b is formed by laser drilling. As shown in FIG. 1, an exposed portion of the first surface 181 of the circuit layer 18 is recessed from the first surface 201 of the dielectric layer 20. In addition, a surface roughness (Ra) of the second surface 202 of the dielectric layer 20 is greater than about 0.15 μm, and a surface roughness (Ra) of the conductive metal layer 14 of the first metal layer 16 is greater than about 0.15 μm. In one or more embodiments, the surface roughness (Ra) of the second surface 202 of the dielectric layer 20 and/or of the conductive metal layer 14 of the first metal layer 16 may be less than about 0.5 μm.

The second metal layer 22 is disposed on the second surface 102 of the carrier 10. In some embodiments, the second metal layer 22 may include a bottom base metal layer and a bottom conductive metal layer. The bottom base metal layer is disposed on the second surface 102 of the carrier 10, and the bottom conductive metal layer is disposed on the bottom base metal layer. In some embodiments, the bottom base metal layer may be a copper foil pressed on or adhered to the carrier 10, and the bottom conductive metal layer may also be a copper foil and adhered to the bottom base metal layer. In some embodiments, a thickness of the bottom base metal layer may differ from a thickness of the bottom conductive metal layer. The thickness of the bottom base metal layer may be in a range of about four to about six times as large as the thickness of the bottom conductive metal layer. For example, the thickness of the bottom base metal layer may be about 18 μm, and the thickness of the bottom conductive metal layer may be about 3 μm.

Figure 4:
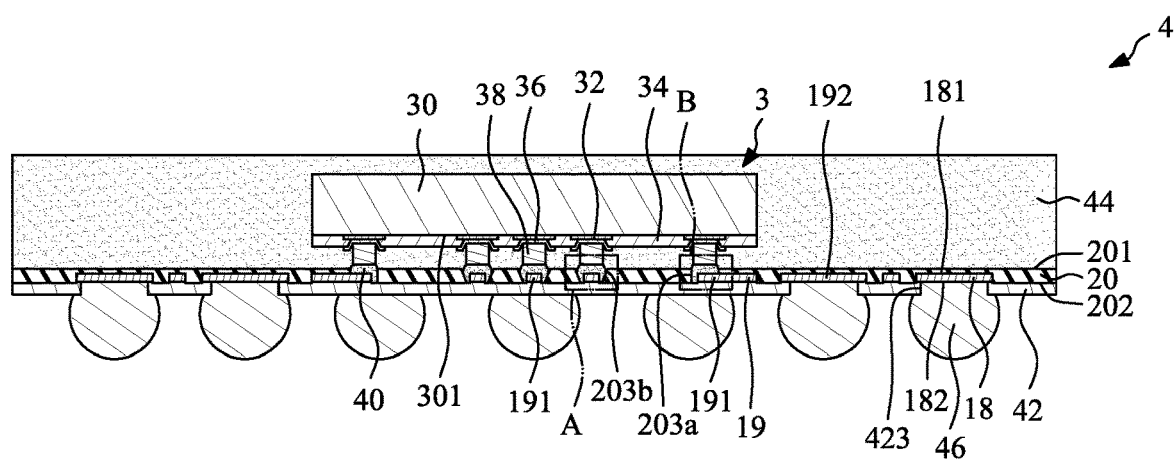
FIG. 4 illustrates a cross sectional view of some embodiments of a semiconductor package structure according to an aspect of the present disclosure.

In the embodiments illustrated in FIG. 1, the circuit layer 18 (e.g. 75% or more of the circuit layer 18, 90% or more of the circuit layer 18, 95% or more of the circuit layer 18, or substantially the entire circuit layer 18) is supported by the first metal layer 16. Therefore, when a molding operation is conducted to the substrate structure 1, there will be substantially no empty space below the solder bump land pad 192 since the solder bump land pad 192 contacts the conductive metal layer 14 of the first metal layer 16. It is noted that the first metal layer 16 (including the base metal layer 12 and the conductive metal layer 14) and the carrier 10 can be removed after the molding operation. Thus, the flow of an encapsulant 44 (as shown in FIG. 4) will have little impact on the solder bump land pad 192, and the solder bump land pad 192 will not substantially deform. Therefore, the thickness and width of the circuit layer 18 can be reduced. For example, the thickness of the circuit layer 18 may be less than about 20 μm (e.g. about 19 μm or less, or about 18 μm or less), and the width of the trace 19 of the circuit layer 18 may be in a range of about 7 μm to about 12 μm. As a result, the line width and a line space (L/S) of the circuit layer 18 can be reduced efficiently. For example, the line width and a line space (L/S) of the circuit layer 18 may be in a range of about 5 μm/about 5 μm to about 12 μm/about 12 μm.

Figure 2:
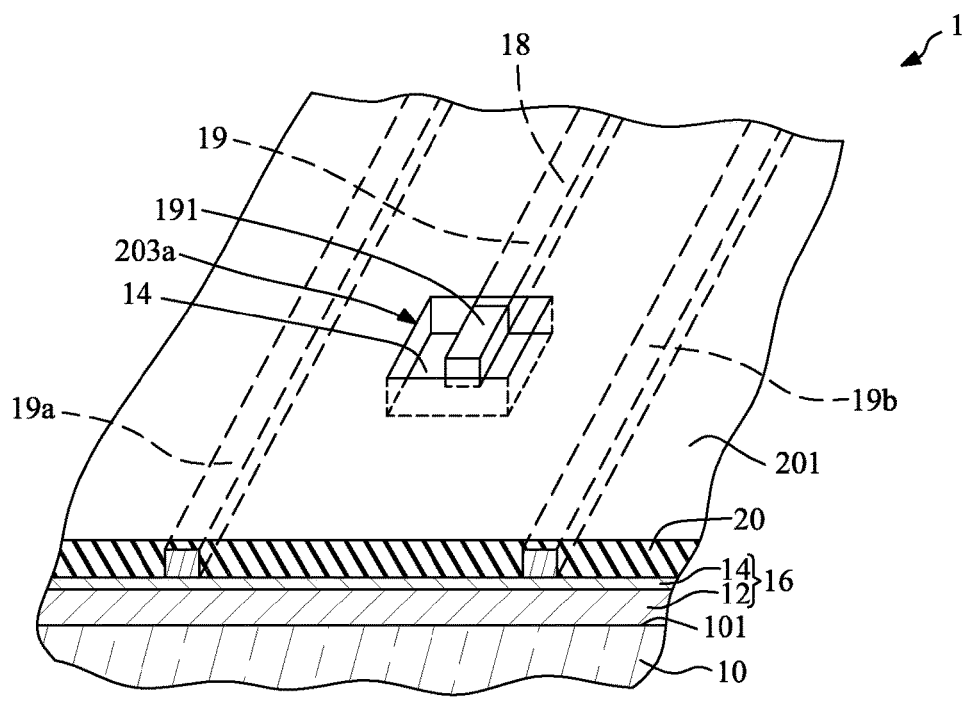
FIG. 2 illustrates a perspective view of some embodiments of a portion of the substrate structure of FIG. 1.
Figure 3:
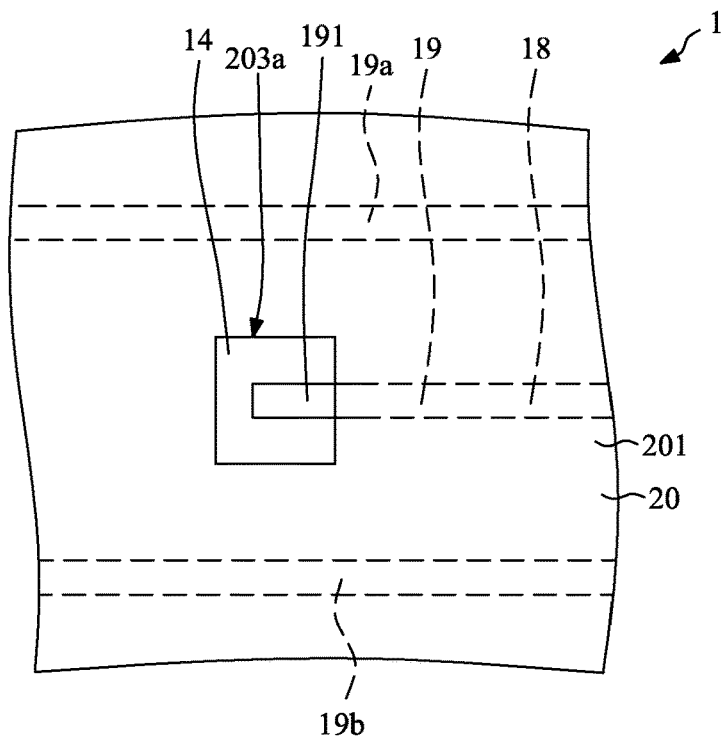
FIG. 3 illustrates a top view of some embodiments of a portion of the substrate structure of FIG. 1.

FIG. 2 illustrates a perspective view of some embodiments of a portion of the substrate structure 1 of FIG. 1. FIG. 3 illustrates a top view of some embodiments of a portion of the substrate structure 1 of FIG. 1. In some embodiments, a size of one or more of the openings 203a, 203b of the dielectric layer 20 may be in a range of about 40 μm*about 40 μm to about 80 μm*about 80 μm. For example, the size of one or more of the openings 203a, 203b of the dielectric layer 20 may be about 40 μm*about 70 μm. In addition, the die pads 191 of the circuit layer 18 and a portion of the conductive metal layer 14 of the first metal layer 16 are exposed in the openings 203a, 203b. The exposed area of the conductive metal layer 14 is substantially equal to the area of the openings 203a, 203b. During a subsequent soldering process, connecting elements 40 (e.g. including solder), as shown in FIG. 4, are respectively disposed in the openings 203a, 203b to contact the die pads 191 and the exposed area of the conductive metal layer 14. If a slight shift of the openings 203a, 203b occurs, the openings 203a, 203b still can expose enough area of the conductive metal layer 14 for the solder to contact, which ensures the soldering quality. Thus, the width of the die pads 191 may be designed to be substantially equal to the width of the trace 19 (the die pads 191 do not need to have a width greater than the width of the trace 19). As shown in FIG. 2 and FIG. 3, since the size of the opening 203a of the dielectric layer 20 can be reduced, a pitch between the trace 19 and the adjacent traces 19a, 19b can be reduced accordingly, and the layout of the circuit layer 18 can have more flexibility. In addition, since the circuit layer 18 is substantially covered by the dielectric layer 20 (except for the die pads 191 exposed in the openings 203a, 203b), there will be little or no risk of a solder bridge occurring. That is, the solder on the die pads 191 of the trace 19 will not contact the adjacent traces 19a, 19b. Further, the solder can contact the exposed area of the conductive metal layer 14, thus, the contact area between the solder and the substrate structure 1 can be well controlled.

FIG. 4 illustrates a cross sectional view of some embodiments of a semiconductor package structure 4 according to an aspect of the present disclosure. The semiconductor package structure 4 includes a circuit layer 18, a dielectric layer 20, a semiconductor die 3, a plurality of connecting elements 40, a protection layer 42, an encapsulant 44 and a plurality of external connectors 46 (e.g., solder bumps).

The circuit layer 18 may be a patterned circuit layer, and may be formed by plating. The circuit layer 18 may include at least one trace 19, at least one die pad 191 and at least one solder bump land pad 192. The circuit layer 18 has a first surface 181 and a second surface 182 opposite to the first surface 181. In some embodiments, a thickness of the circuit layer 18 is in a range of about 10 μm to about 15 μm, and a line width and a line space (L/S) of the circuit layer 18 is in a range of about 5 μm/about 5 μm to about 12 μm/about 12 μm.

The dielectric layer 20 covers the first surface 181 of the circuit layer 18. The dielectric layer 20 may include, or be formed from, a photoresist layer, a cured photosensitive material, a cured photoimageable dielectric (PID) material such as a polyamide (PA), a polyimide (PI), an epoxy or polybenzoxazole (PBO), or a combination of two or more thereof. The dielectric layer 20 has a first surface 201 and a second surface 202 opposite to the first surface 201. A thickness of the dielectric layer 20 is greater than a thickness of the circuit layer 18 (e.g. by a ratio of about 1.3 or more, about 1.5 or more, or about 1.7 or more), so that the first surface 201 of the dielectric layer 20 is higher than (and, for example, covers at least a portion of) the first surface 181 of the circuit layer 18. The second surface 182 of the circuit layer 18 is exposed from the second surface 202 of the dielectric layer 20, and the circuit layer 18 does not protrude from the second surface 202 of the dielectric layer 20. In one or more embodiments, the second surface 182 of the circuit layer 18 may be recessed from the second surface 202 of the dielectric layer 20. In other embodiments, the second surface 182 of the circuit layer 18 may be substantially coplanar with the second surface 202 of the dielectric layer 20.

The dielectric layer 20 defines a plurality of openings (including, for example, a plurality of first openings 203a and a plurality of second openings 203b) extending through the dielectric layer 20 to expose portions (e.g., the die pads 191) of the circuit layer 18. In some embodiments, a shape of a cross section of the first opening 203a is different from a shape of a cross section of the second opening 203b. For example, an inclination angle between the first surface 201 of the dielectric layer 20 and a side wall of the first opening 203a may be substantially equal to 90 degrees, and an inclination angle between the first surface 201 of the dielectric layer 20 and a side wall of the second opening 203b may be greater than about 90 degrees (e.g. may be in a range from about 91 degrees to about 135 degrees). In one or more embodiments, this is because the first opening 203a is formed by exposure and development, and the second opening 203b is formed by laser drilling. It is noted that a size of the first opening 203a may be substantially the same as or different form a size of the second opening 203b. As shown in FIG. 4, a portion of the first surface 181 of the circuit layer 18 is recessed from the first surface 201 of the dielectric layer 20. In addition, a surface roughness (Ra) of the second surface 202 of the dielectric layer 20 is greater than about 0.15 μm (e.g. is about 0.17 μm or greater, or is about 0.19 μm or greater).

The semiconductor die 3 is attached to the circuit layer 18 by flip chip bonding. In some embodiments, the semiconductor die 3 includes a main body 30, a metal conductive layer 32, a plurality of seed layers 36, a plurality of copper pillars 38 and a passivation layer 34. The main body includes an active surface 301. The metal conductive layer 32 is disposed on the active surface 301. In some embodiments, the metal conductive layer 32 includes a plurality of segments insulated from each other, and the material of the segments includes, for example, aluminum (Al), Cu, another conductive metal, or an alloy (e.g., AlCu). The passivation layer 34 covers the active surface 301 and the metal conductive layer 32, and defines a plurality of openings to expose portions of the metal conductive layer 32. The copper pillars 38 are disposed adjacent to the metal conductive layer 32, and are electrically connected to the metal conductive layer 32. In the embodiments illustrated in FIG. 4, the seed layer 36 is disposed on the metal conductive layer 32 in the openings of the passivation layer 34, and the copper pillars 38 are disposed on the seed layer 36. That is, a portion of the seed layer 36 is disposed between each of the copper pillars 38 and the metal conductive layer 32. However, the seed layer 36 may be omitted, and the copper pillars 38 may be disposed on the metal conductive layer 32 directly. In one or more embodiments, a material of the seed layer 36 is a titanium alloy (e.g., a titanium-copper (TiCu) alloy).

The connecting elements 40 (e.g., solder bumps) electrically connecting the semiconductor die 3 and the circuit layer 18. At least a portion of one or more of the connecting elements 40 is disposed in one or more of the openings 203a, 203b of the dielectric layer 20, and is exposed from the second surface 202 of the dielectric layer 20. As shown in FIG. 4, each of the connecting elements 40 are respectively disposed between one of the copper pillars 38 and one of the die pads 191 of the circuit layer 18. In some embodiments, the connecting elements 40 contact the copper pillars 38 and the die pads 191 directly, so that the copper pillars 38 of the semiconductor die 3 are electrically connected to the circuit layer 18 through the connecting elements 40. A material of the connecting elements 40 (e.g., the solder bumps) may include tin (Sn) or a tin-silver (SnAg) alloy.

The protection layer 42 is disposed on the second surface 202 of the dielectric layer 20 to cover a portion of the circuit layer 18. The protection layer 42 defines a plurality of openings 423 to expose portions (e.g., the solder ball land pad 192) of the second surface 182 of the circuit layer 18. A material of the protection layer 42 may be the same as or different from a material of the dielectric layer 20.

The encapsulant 44 (e.g., a molding compound) covers the semiconductor die 3 and the dielectric layer 20. As shown in FIG. 4, the encapsulant 44 further extends into a space between the semiconductor die 3 and the dielectric layer 20 so as to cover the copper pillars 38 and the connecting elements 40. However, in some embodiments, an underfill may be disposed in the space between the semiconductor die 3 and the dielectric layer 20 to cover the copper pillars 38 and the connecting elements 40 (e.g. instead of, or in addition to, the encapsulant 44), and thus, the encapsulant 44 may contact the underfill. In addition, a side surface of the encapsulant 44 may substantially coplanar with a side surface of the dielectric layer 20 and a side surface of the protection layer 42 (e.g. since the encapsulant 44, the dielectric layer 20 and the protection layer 42 are cut concurrently at a same stage of manufacture).

The external connectors 46 (e.g., solder bumps) are respectively formed or disposed in a respective one of the opening 423 and on the exposed portions (e.g., the solder bump land pads 192) of the circuit layer 18 for external connection. For example, the external connectors 46 (e.g., solder bumps) are used to connect the solder bump land pads 192 to a printed circuit board (PCB).

Figure 5:
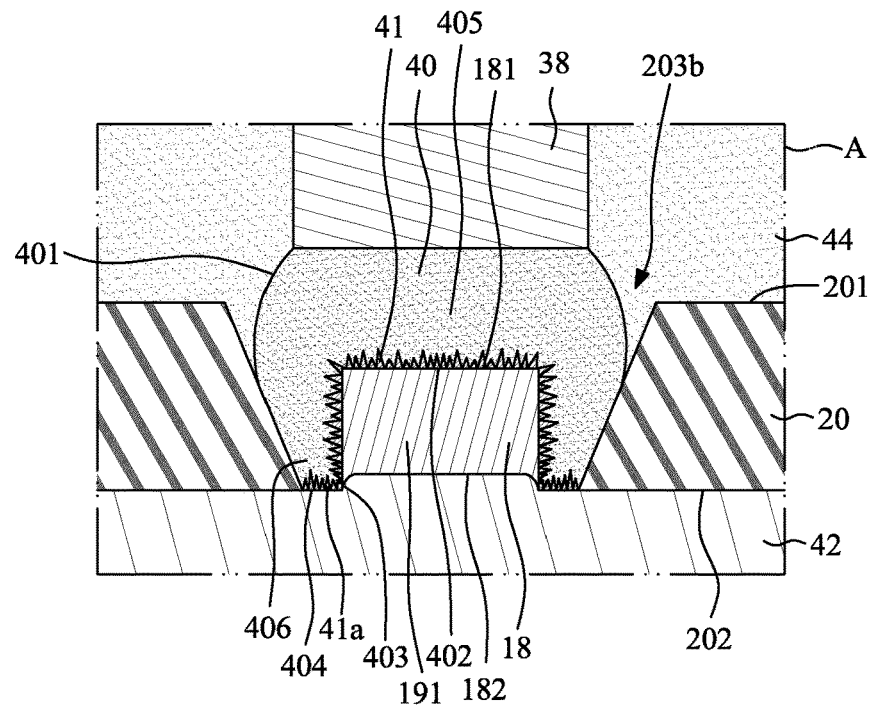
FIG. 5 illustrates an enlarged view of an area "A" of the semiconductor package structure of FIG. 4.

FIG. 5 illustrates an enlarged view of an area "A" of the semiconductor package structure 4 of FIG. 4. The position of the area "A" corresponds to the position of the second opening 203b of the dielectric layer 20. As shown in FIG. 5, an inclination angle between the first surface 201 of the dielectric layer 20 and the side wall of the second opening 203b may be greater than about 90 degrees (e.g. may be in a range from about 91 degrees to about 135 degrees). In one or more embodiments, this is because the second opening 203b may be formed by laser drilling. The depicted connecting element 40 has a periphery surface 401, a first surface 402, an inner side surface 403, a second surface 404, a central portion 405 and a bottom portion 406. The periphery surface 401 may contact the side wall of the second opening 203b. The first surface 402 is an interface between the central portion 405 and the die pad 191. The inner side surface 403 is an interface between the bottom portion 406 and the protection layer 42, and is below the die pad 191. The second surface 404 is an interface between the bottom portion 406 and the protection layer 42, and is below the bottom portion 406. Therefore, the inner side surface 403 and the second surface 404 of the bottom portion 406 of the connecting element 40 are exposed from the second surface 202 of the dielectric layer 20, and the protection layer 42 contacts the inner side surface 403 and the second surface 404 of the connecting element 40. In some embodiments, the connecting element 40 substantially fills the second opening 203b of the dielectric layer 20. Thus, one or more of the exposed portions (e.g., the exposed second surface 404 of the bottom portion 406) of the connecting element 40 are defined by the bottom of the second opening 203b of the dielectric layer 20. In addition, the second surface 404 of the connecting element 40 is coplanar with the second surface 202 of the dielectric layer 20, and the second surface 182 of the circuit layer 18 is recessed from the second surface 202 of the dielectric layer 20 and the second surface 404 of the connecting element 40. In some embodiments, a surface roughness (Ra) of a second surface 404 of the connecting element 40 is greater than a surface roughness (Ra) of a second surface 182 of the circuit layer 18 (e.g. by a factor of about 1.3 or more, about 1.5 or more, or about 1.7 or more).

As shown in FIG. 5, the central portion 405 of the connecting element 40 includes a first intermetallic compound (IMC) 41 disposed adjacent to the first surface 402, and the bottom portion 406 of the connecting element 40 includes a second IMC 41a disposed adjacent to the inner side surface 403 and the second surface 404. The first IMC 41 is a result of the metal interaction between the connecting element 40 and the die pad 191, and the second IMC 41a is a result of the metal interaction between the connecting element 40 and the conductive metal layer 14 of the first metal layer 16 (FIG. 1). In one or more embodiments, a material of the die pad 191 may be the same as a material of the conductive metal layer 14, and thus, a material of the first IMC 41 may be the same as a material of the second IMC 41a. However, the material of the die pad 191 may be different from the material of the conductive metal layer 14, and thus, the material of the first IMC 41 may be different from the material of the second IMC 41a. For example, the first IMC 41 and the second IMC 41a may include a Cu, nickel (Ni), Sn combination, a gold (Au), Sn combination such as $AuSn_4$, a palladium (Pd), Sn combination such as $PdSn_4$, or both an Au, Sn combination and a Pd, Sn combination. In an embodiment, the first IMC 41 and the second IMC 41a may include $(Cu, Ni, Au, Pd)_6Sn_5$ (e.g., one or more of $Cu_6Sn_5$, $Ni_6Sn_5$, $Au_6Sn_5$ or $Pd_6Sn_5$) and/or other IMCs. In an embodiment, the first IMC 41 and the second IMC 41a may include $(Au, Pd, Ni)Sn_4$ (e.g., one or more of $AuSn_4$, $PdSn_4$ or $NiSn_4$) and/or other IMCs. As shown in FIG. 4, the first IMC 41 and the second IMC 41a may be formed discontinuously. That is, the first IMC 41 and the second IMC 41a may be a discontinuous structure, or each of the first IMC 41 and the second IMC 41a may not have a consistent thickness. It is noted that a volume ratio of the combined volume of the first IMC 41 and the second IMC 41a to the volume of the connecting element 40 can be controlled to be less than about 80% (e.g. about 75% or less, or about 70% or less), thereby avoiding joint cracking and increasing mechanical reliability of the semiconductor flip-chip bonded device. An additional benefit of controlling the intermetallic bonding to form the first IMC 41 and the second IMC 4a1 is that voids in the connecting element 40 are avoided; thus, the lifetime of the semiconductor flip-chip bonded device is increased.

Figure 6:
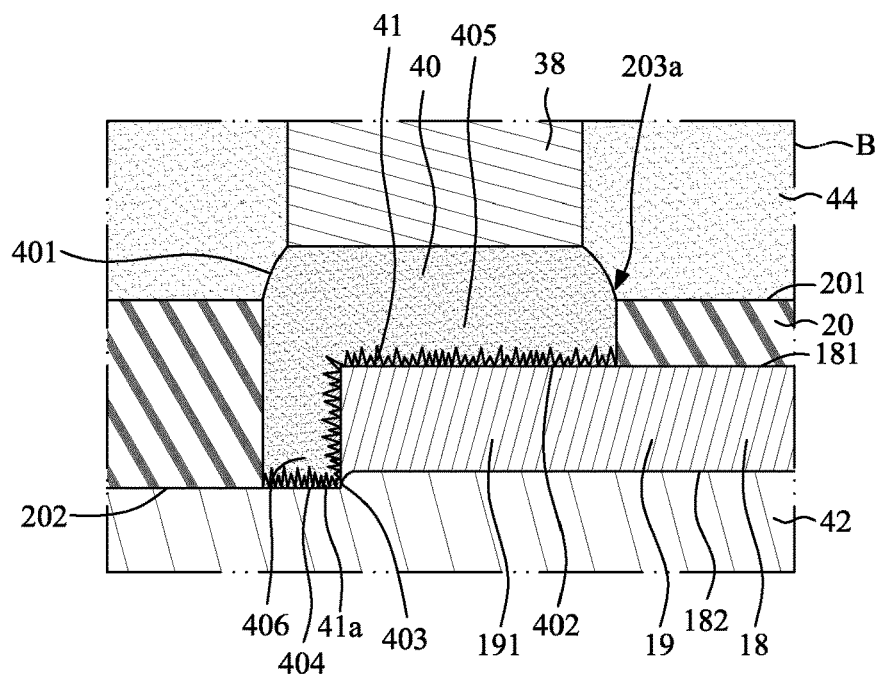
FIG. 6 illustrates an enlarged view of an area "B" of the semiconductor package structure of FIG. 4.

FIG. 6 illustrates an enlarged view of an area "B" of the semiconductor package structure 4 of FIG. 4. The position of the area "B" corresponds to the position of the first opening 203a of the dielectric layer 20. As shown in FIG. 6, an inclination angle between the first surface 201 of the dielectric layer 20 and a side wall of the first opening 203a may be substantially equal to 90 degrees. In one or more embodiments, this is because the first opening 203a may be formed by exposure and development.

Figure 7:
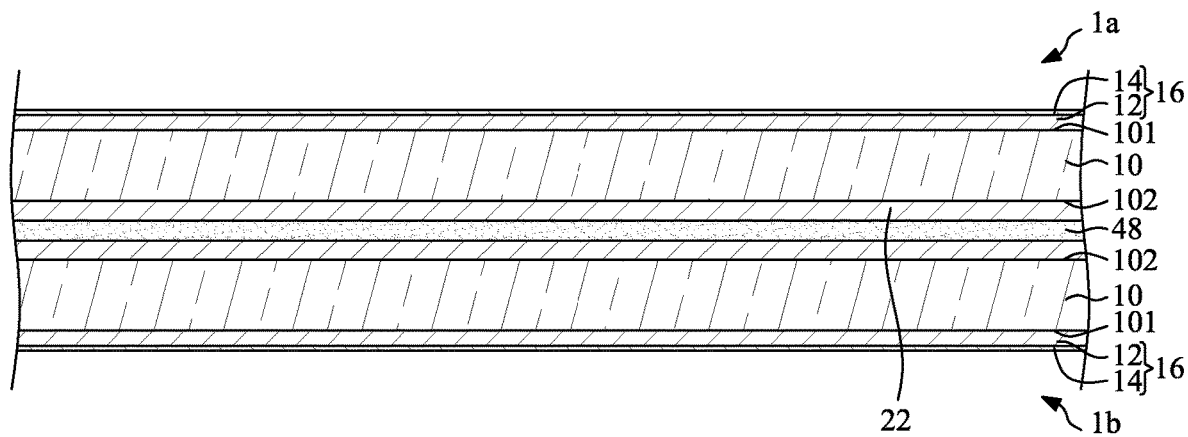
FIG. 7 illustrates one or more stages of some embodiments of a method for manufacturing a semiconductor package structure according to an aspect of the present disclosure.

FIG. 7 through FIG. 21 illustrate various stages of some embodiments of a method for manufacturing a semiconductor package structure according to an aspect of the present disclosure. In some embodiments, the method is for manufacturing a substrate structure such as the substrate structure 1 shown in FIG. 1. Besides, the method is also for manufacturing a semiconductor package structure such as the semiconductor package structure 4 shown in FIG. 4. Referring to FIG. 7, a carrier 10 is provided. The carrier 10 may include, for example, a metal material, a ceramic material, a glass material, a dielectric material or a semiconductor wafer. The shape of the carrier 10 may be, for example, substantially rectangular or square. Alternatively, the shape of the carrier 10 may be, for example, substantially circular or elliptical. The carrier 10 has a first surface 101 and a second surface 102 opposite to the first surface 101. A first metal layer 16 is disposed on the first surface 101 of the carrier 10. In the embodiments illustrated in FIG. 7, the first metal layer 16 may include a base metal layer 12 and a conductive metal layer 14. The base metal layer 12 is disposed on the first surface 101 of the carrier 10, and the conductive metal layer 14 is disposed on the base metal layer 12. In some embodiments, the base metal layer 12 may be a copper foil and is pressed on or adhered to the carrier 10, and the conductive metal layer 14 may also be a copper foil and is adhered to the base metal layer 12. In some embodiments, a thickness of the base metal layer 12 may differ from a thickness of the conductive metal layer 14. The thickness of the base metal layer 12 may be in a range of about four to about six times as large as the thickness of the conductive metal layer 14. For example, the thickness of the base metal layer 12 may be about 18 μm, and the thickness of the conductive metal layer 14 may be about 3 μm.

A second metal layer 22 is further disposed on the second surface 102 of the carrier 10. In some embodiments, the second metal layer 22 may include a bottom base metal layer and a bottom conductive metal layer. The bottom base metal layer is disposed on the second surface 102 of the carrier 10, and the bottom conductive metal layer is disposed on the bottom base metal layer. In some embodiments, the bottom base metal layer may be a copper foil and is pressed on or adhered to the carrier 10, and the bottom conductive metal layer may also be a copper foil and is adhered to the bottom base metal layer. In some embodiments, a thickness of the bottom base metal layer may differ from a thickness of the bottom conductive metal layer. The thickness of the bottom base metal layer may be in a range of about four to about six times as large as the thickness of the bottom conductive metal layer. For example, the thickness of the bottom base metal layer may be about 18 μm, and the thickness of the bottom conductive metal layer may be about 3 μm.

As shown in FIG. 7, a top structure 1a and a bottom structure 1b are attached together by a release layer 48. In some embodiments, the elements of the top structure 1a are the same as, or similar to, the elements of the bottom structure 1b. That is, both the top structure 1a and the bottom structure 1b include an implementation of the carrier 10, the first metal layer 16 and the second metal layer 22. For example, the second metal layer 22 of the top structure 1a is attached to the second metal layer 22 of the bottom structure 1b by the release layer 48. Therefore, processes described below may be performed on one of the top structure 1a and the bottom structure 1b, or both of the top structure 1a and the bottom structure 1b concurrently. For simplicity, description of some such processes may be described herein with reference to one of the top structure 1a and the bottom structure 1b, but the processes may be performed concurrently on both of the top structure 1a and the bottom structure 1b.

Figure 8:
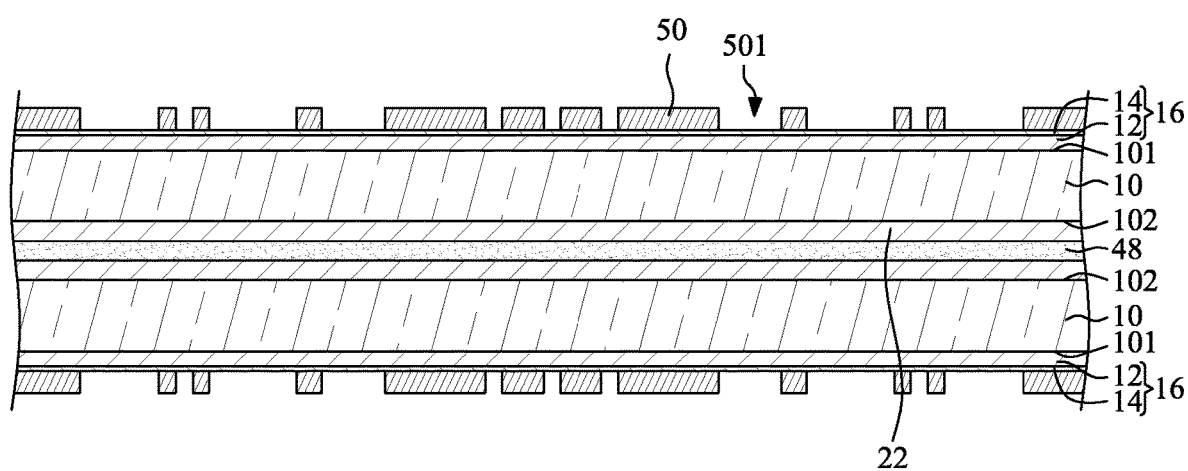
FIG. 8 illustrates one or more stages of some embodiments of a method for manufacturing a semiconductor package structure according to an aspect of the present disclosure.

Referring to FIG. 8, a photoresist layer 50 (e.g., a dry film) is formed on the conductive metal layer 14 of the first metal layer 16 by, for example, laminating. Then, a plurality of openings 501 extending through the photoresist layer 50 are formed by, for example, exposure and development.

Figure 9:
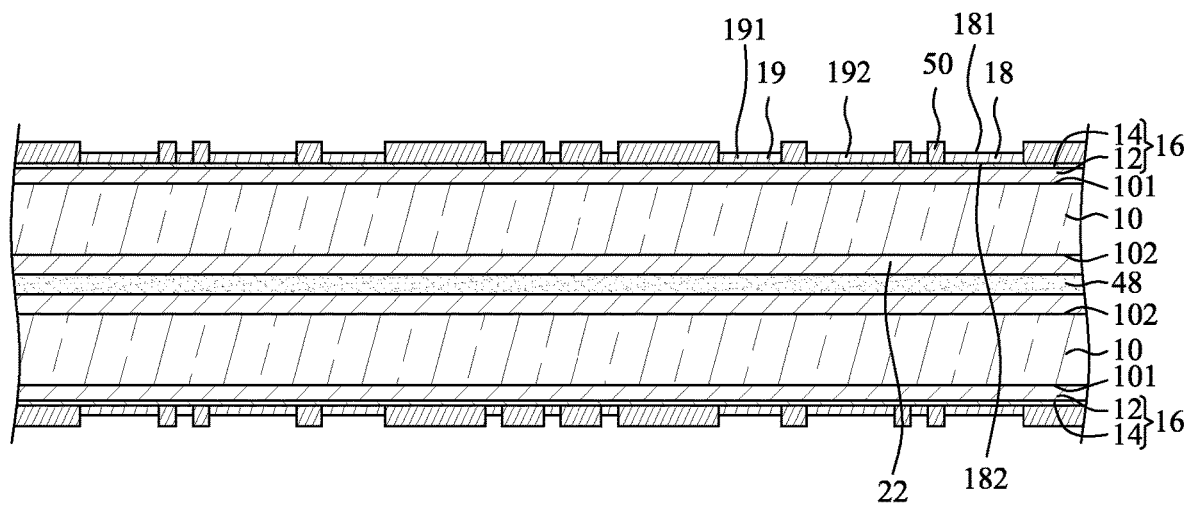
FIG. 9 illustrates one or more stages of some embodiments of a method for manufacturing a semiconductor package structure according to an aspect of the present disclosure.

Referring to FIG. 9, a circuit layer 18 is formed in the openings 501 of the photoresist layer 50 and is disposed on the first metal layer 16. In some embodiments, the circuit layer 18 is disposed on the conductive metal layer 14 of the first metal layer 16. In some embodiments, the circuit layer 18 may be a patterned circuit layer, and may be formed by plating. The circuit layer 18 may include at least one trace 19, at least one die pad 191 and at least one solder bump land pad 192. The circuit layer 18 has a first surface 181 and a second surface 182 opposite to the first surface 181. The second surface 182 of the circuit layer 18 contacts the conductive metal layer 14 of the first metal layer 16 directly. In some embodiments, a thickness of the circuit layer 18 is in a range of about 10 μm to about 15 μm, and a line width and a line space (L/S) of the circuit layer 18 is in a range of about 5 μm/about 5 μm to about 12 μm/about 12 μm.

Figure 10:
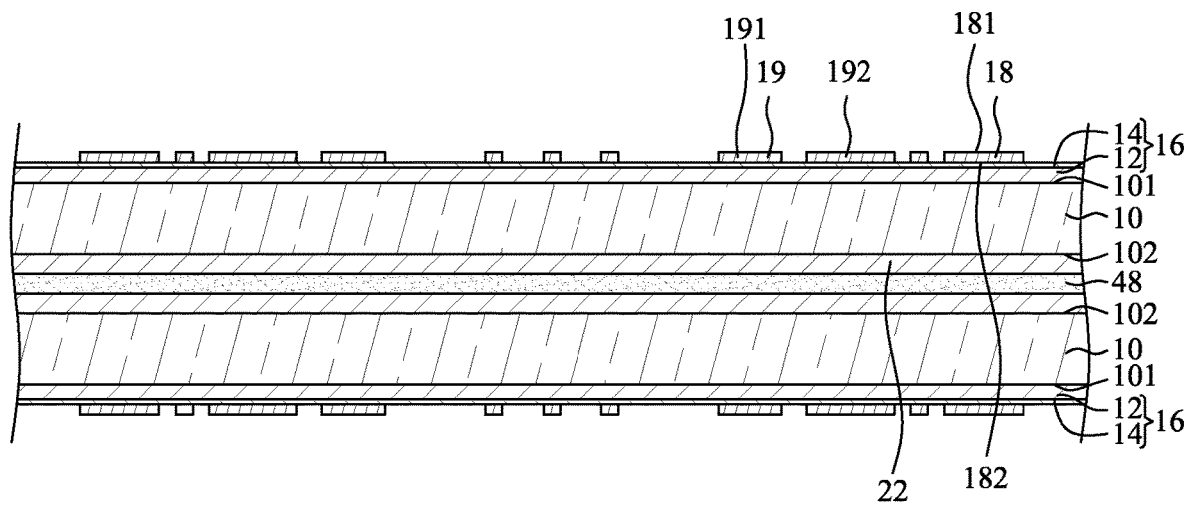
FIG. 10 illustrates one or more stages of some embodiments of a method for manufacturing a semiconductor package structure according to an aspect of the present disclosure.

Referring to FIG. 10, the photoresist layer 50 is removed by, for example, stripping.

Figure 11:
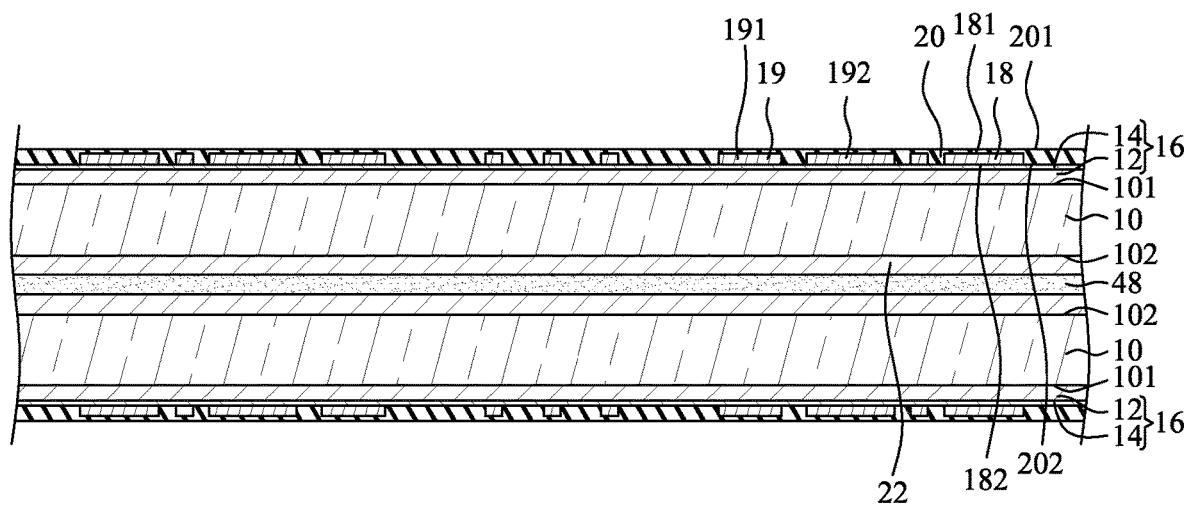
FIG. 11 illustrates one or more stages of some embodiments of a method for manufacturing a semiconductor package structure according to an aspect of the present disclosure.

Referring to FIG. 11, a dielectric layer 20 is formed to cover the circuit layer 18 and the conductive metal layer 14 of the first metal layer 16 by, for example, laminating. The dielectric layer 20 may include, or be formed from, a photoresist layer, a cured photosensitive material, a cured photoimageable dielectric (PID) material such as a polyamide (PA), a polyimide (PI), an epoxy or polybenzoxazole (PBO), or a combination of two or more thereof. The dielectric layer 20 has a first surface 201 and a second surface 202 opposite to the first surface 201. A thickness of the dielectric layer 20 is greater than a thickness of the circuit layer 18 (e.g. by a ratio of about 1.3 or more, about 1.5 or more, or about 1.7 or more), so that the second surface 202 of the dielectric layer 20 is substantially coplanar with the second surface 182 of the circuit layer 18, and the first surface 201 of the dielectric layer 20 is higher than (and, for example, covers at least a portion of) the first surface 181 of the circuit layer 18. In addition, a surface roughness (Ra) of the second surface 202 of the dielectric layer 20 is greater than about 0.15 μm and a surface roughness (Ra) of the conductive metal layer 14 of the first metal layer 16 is greater than about 0.15 μm. In one or more embodiments, the surface roughness (Ra) of the second surface 202 of the dielectric layer 20 and/or of the conductive metal layer 14 of the first metal layer 16 may be less than about 0.5 μm.

Figure 12:
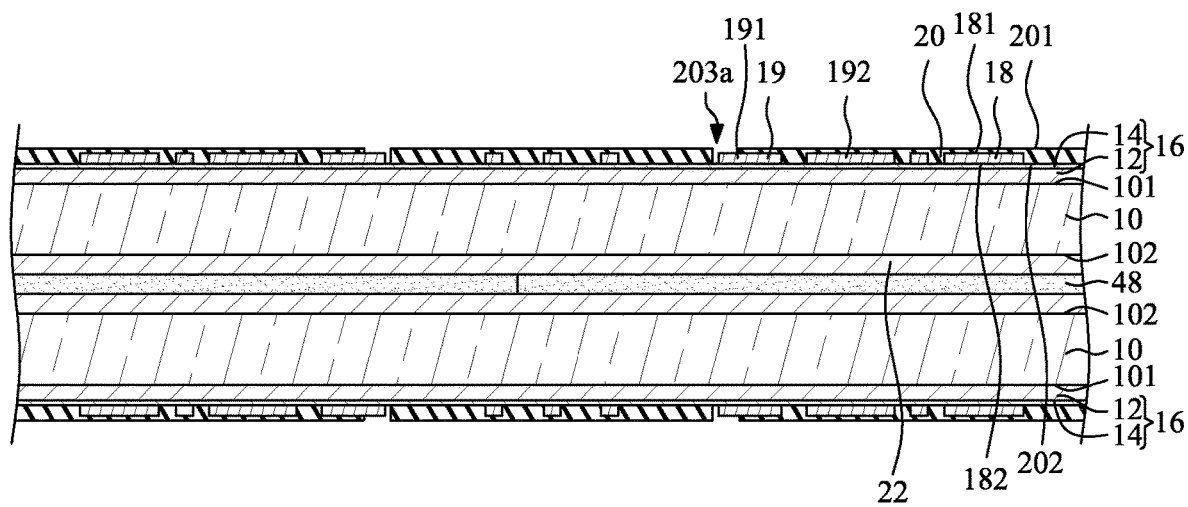
FIG. 12 illustrates one or more stages of some embodiments of a method for manufacturing a semiconductor package structure according to an aspect of the present disclosure.

Referring to FIG. 12, a plurality of first openings 203a are formed in the dielectric layer 20 to expose portions (e.g., the die pads 191) of the circuit layer 18 and portions of the conductive metal layer 14 of the first metal layer 16. The first openings 203a extend through the dielectric layer 20. A width of the first openings 203a of the dielectric layer 20 are greater than a width of the trace 19 (e.g. by a ratio of about 1.1 or more, about 1.2 or more, or about 1.3 or more) of the circuit layer 18 so as to expose a first surface 181 and at least two side surfaces of the trace 19 of the circuit layer 18. It is noted that the exposed portions of the trace 19 includes the die pads 191. In some embodiments, an inclination angle between the first surface 201 of the dielectric layer 20 and a side wall of the first opening 203a may be substantially equal to 90 degrees. This is because the first opening 203a is formed by exposure and development.

Figure 13:
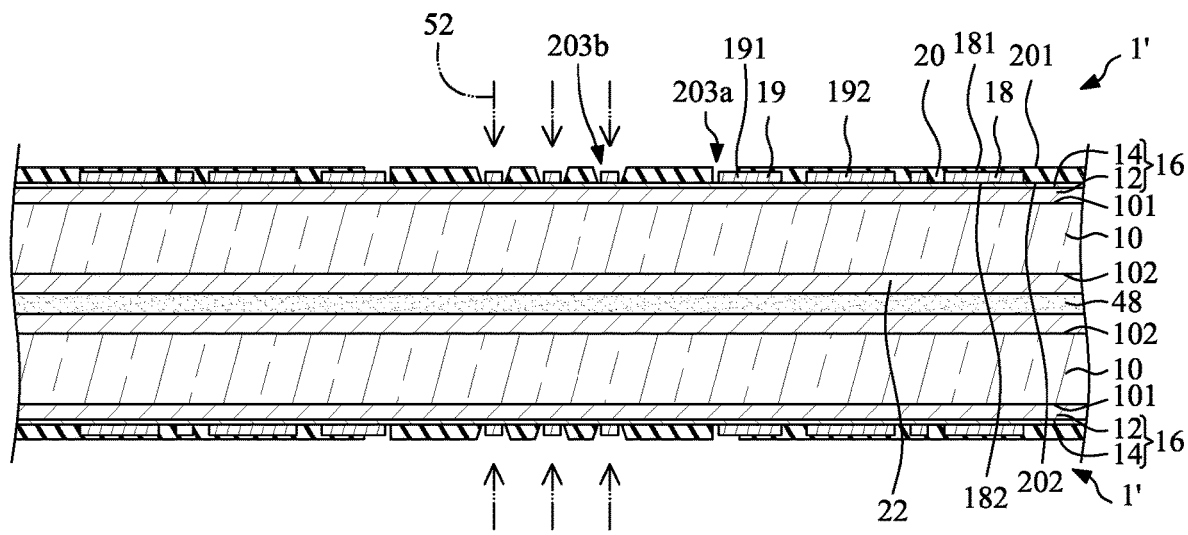
FIG. 13 illustrates one or more stages of some embodiments of a method for manufacturing a semiconductor package structure according to an aspect of the present disclosure.

Referring to FIG. 13, a plurality of second openings 203b are formed in the dielectric layer 20 to expose portions (e.g., the die pads 191) of the circuit layer 18 and portions of the conductive metal layer 14 of the first metal layer 16. The second openings 203b extend through the dielectric layer 20. A width of the second opening 203b of the dielectric layer 20 is greater than a width of the trace 19 of the circuit layer 18 (e.g. by a ratio of about 1.1 or more, about 1.2 or more, or about 1.3 or more) so as to expose a first surface 181 and at least two side surfaces of the trace 19 of the circuit layer 18. It is noted that the exposed portions of the trace 19 includes the die pads 191. In some embodiments, an inclination angle between the first surface 201 of the dielectric layer 20 and a side wall of the second opening 203b may be greater than about 90 degrees (e.g. may be in a range from about 91 degrees to about 135 degrees). This is because the second opening 203b is formed by laser 50. Thus, each of the top structure 1a and the bottom structure 1b is manufactured to become a substrate structure 1'.

Figure 14:
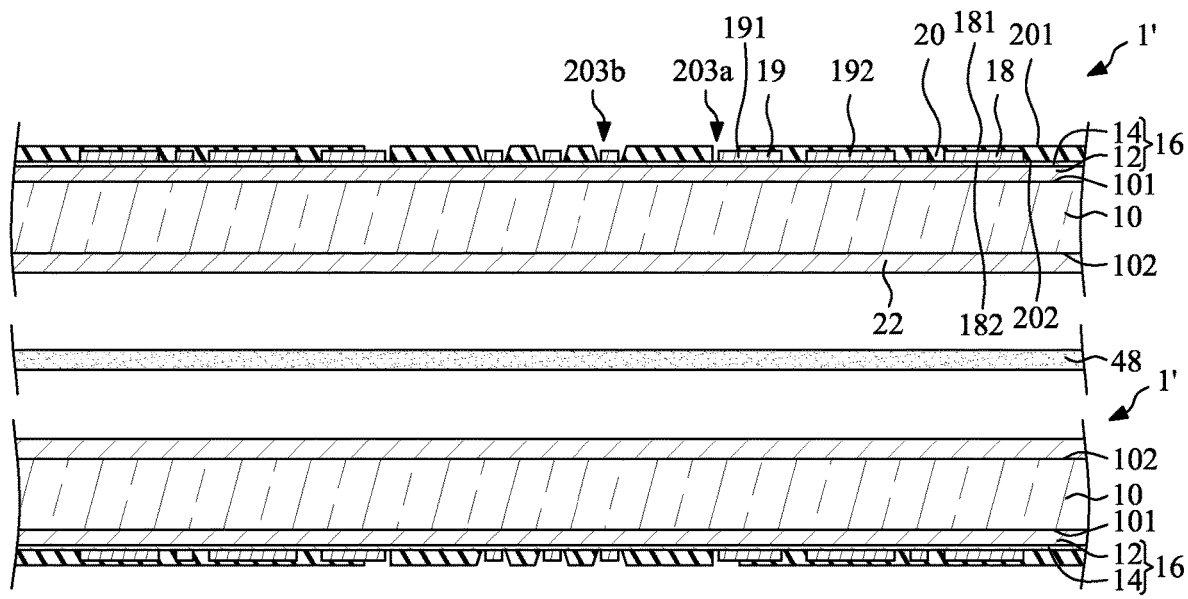
FIG. 14 illustrates one or more stages of some embodiments of a method for manufacturing a semiconductor package structure according to an aspect of the present disclosure.

Referring to FIG. 14, the substrate structures 1' are separated from the release layer 48 by, for example, thermal release. It is noted that the substrate structure 1' may be singulated to form a plurality of substrate structures 1 as shown in FIG. 1.

Figure 15:
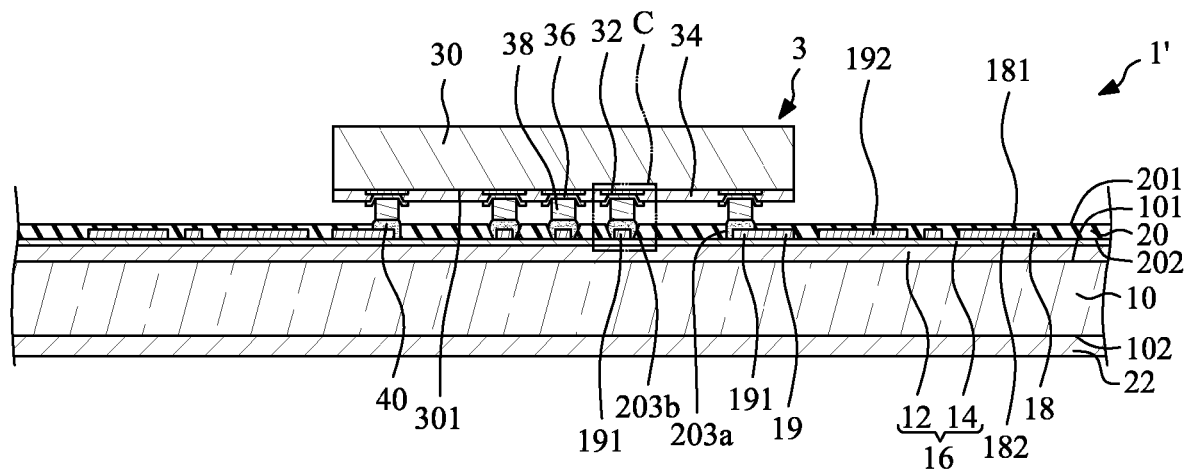
FIG. 15 illustrates one or more stages of some embodiments of a method for manufacturing a semiconductor package structure according to an aspect of the present disclosure.

Referring to FIG. 15, one of the substrate structures 1' is provided. As discussed above, the substrate structure 1' includes the carrier 10, the first metal layer 16, the circuit layer 18, the dielectric layer 20 and the second metal layer 22. Then, a semiconductor die 3 is attached to the substrate structure 1' by flip chip bonding through a plurality of connecting elements 40.

In some embodiments, the semiconductor die 3 includes a main body 30, a metal conductive layer 32, a plurality of seed layers 36, a plurality of copper pillars 38 and a passivation layer 34. The main body includes an active surface 301. The metal conductive layer 32 is disposed on the active surface 301. In some embodiments, the metal conductive layer 32 includes a plurality of segments insulated from each other, and the material of the segments includes, for example, Al, Cu, another conductive metal, or an alloy (e.g., AlCu). The passivation layer 34 covers the active surface 301 and the metal conductive layer 32, and defines a plurality of openings to expose portions of the metal conductive layer 32. The copper pillars 38 are disposed adjacent to the metal conductive layer 32, and are electrically connected to the metal conductive layer 32. In the embodiments illustrated in FIG. 15, the seed layer 36 is disposed on the metal conductive layer 32 in the openings of the passivation layer 34, and the copper pillars 38 are disposed on the seed layer 36. That is, a portion of the seed layer 36 is disposed between each of the copper pillars 38 and the metal conductive layer 32. However, the seed layer 36 may be omitted, and the copper pillars 38 may be disposed on the metal conductive layer 32 directly. In an embodiment, the material of the seed layer 36 is a titanium alloy (e.g., TiCu).

The connecting elements 40 (e.g., solder bumps) electrically connect the semiconductor die 3 and the circuit layer 18. At least a portion of each of the connecting elements 40 is respectively disposed on the exposed portions (e.g., the die pads 191) of the circuit layer 18 and the exposed portion of the conductive metal layer 14 of the first metal layer 16 in the openings 203a, 203b of the dielectric layer 20. As shown in FIG. 15, each of the connecting elements 40 is respectively disposed between one of the copper pillars 38 and the die pads 191 of the circuit layer 18. In some embodiments, the connecting elements 40 contact the copper pillars 38 and the die pads 191 directly, so that the copper pillars 38 of the semiconductor die 3 are electrically connected to the circuit layer 18 through the connecting element 40. The material of the connecting element 40 may include tin (Sn) or tin-silver (SnAg) alloy.

Figure 16:
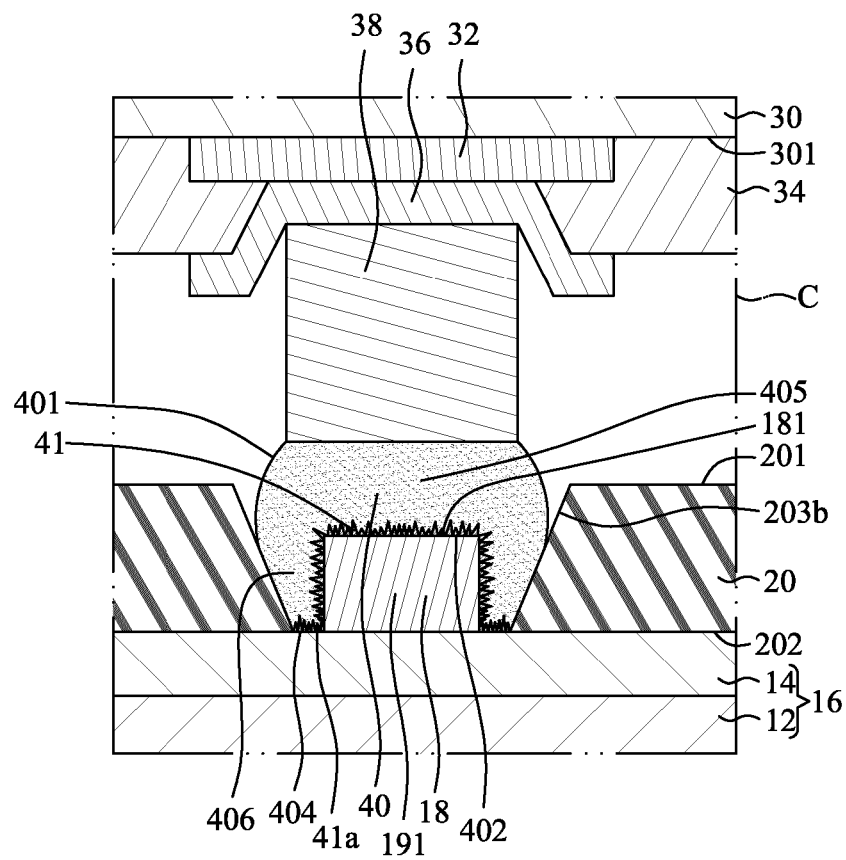
FIG. 16 illustrates an enlarged view of an area "C" of FIG. 15.

FIG. 16 illustrates an enlarged view of an area "C" of FIG. 15. The position of the area "C" corresponds to the position of the second opening 203b of the dielectric layer 20. The connecting element 40 includes a periphery surface 401, a first surface 402, a second surface 404, a central portion 405 and a bottom portion 406. The periphery surface 401 may contact the side wall of the second opening 203b. The first surface 402 is an interface between the central portion 405 and the die pad 191. The second surface 404 is an interface between the bottom portion 406 and the conductive metal layer 14. In some embodiments, the connecting element 40 substantially fills the first opening 203a or the second opening 203b of the dielectric layer 20, and thus, covers and contacts the exposed portions of the conductive metal layer 14 of the first metal layer 16 in the opening 203a or 203b of the dielectric layer 20. Thus, the second surface 404 of the bottom portion 406 of the connecting element 40 is defined by the bottom of the first opening 203a or the second opening 203b of the dielectric layer 20. In addition, the second surface 404 of the connecting element 40 is coplanar with the second surface 202 of the dielectric layer 20.

As shown in FIG. 16, the central portion 405 of the connecting element 40 includes a first intermetallic compound (IMC) 41 disposed adjacent to the first surface 402, and the bottom portion 406 of the connecting element 40 includes a second IMC 41a disposed adjacent to the second surface 404. The first IMC 41 is a result of the metal interaction between the connecting element 40 and the die pad 191, and the second IMC 41a is a result of the metal interaction between the connecting element 40 and the conductive metal layer 14 of the first metal layer 16. In one or more embodiments, a material of the die pad 191 may be the same as a material of the conductive metal layer 14, and thus, a material of the first IMC 41 may be the same as a material of the second IMC 41a. However, the material of the the die pad 191 may be different from the material of the conductive metal layer 14, and thus, the material of the first IMC 41 may be different from the material of the second IMC 41a. For example, the first IMC 41 and the second IMC 41a may include a Cu, Ni, Sn combination, an Au, Sn combination such as $AuSn_4$, a Pd, Sn combination such as $PdSn_4$, or both an Au, Sn combination and a Pd, Sn combination. In an embodiment, the first IMC 41 and the second IMC 41a may include $(Cu, Ni, Au, Pd)_6Sn_5$ (e.g., one or more of $Cu_6Sn_5$, $Ni_6Sn_5$, $Au_6Sn_5$ or $Pd_6Sn_5$) and other IMCs. In an embodiment, the first IMC 41 and the second IMC 41a may include $(Au, Pd, Ni)Sn_4$ (e.g., one or more of $AuSn_4$, $PdSn_4$ or $NiSn_4$) and other IMCs. As shown in FIG. 16, the first IMC 41 and the second IMC 41a may be formed discontinuously. That is, the first IMC 41 and the second IMC 41a may be a discontinuous structure, or each of the first IMC 41 and the second IMC 41a may not have a consistent thickness. It is noted that the volume ratio of the combined volume of the first IMC 41 and the second IMC 41a to the volume of the connecting element 40 is controlled to be less than 80% (e.g. 75% or less, or 70% or less), thereby avoiding joint cracking and increasing mechanical reliability of the semiconductor flip-chip bonded device. An additional benefit of controlling the intermetallic bonding to form the first IMC 41 and the second IMC 4a1 is that voids in the connecting element 40 are avoided; thus, the lifetime of the semiconductor flip-chip bonded device is increased.

Figure 17:
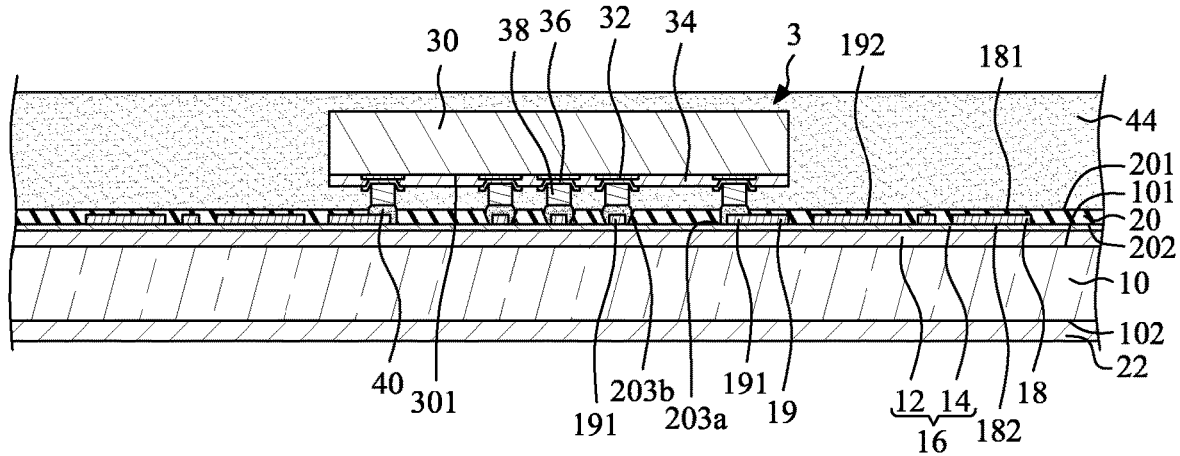
FIG. 17 illustrates one or more stages of some embodiments of a method for manufacturing a semiconductor package structure according to an aspect of the present disclosure.

Referring to FIG. 17, a molding operation is conducted. An encapsulant 44 (e.g., a molding compound) is formed to cover the semiconductor die 3 and the dielectric layer 20 of the substrate structure 1'. As shown in FIG. 17, the encapsulant 44 further extends into the space between the semiconductor die 3 and the dielectric layer 20 so as to cover the copper pillars 38 and the connecting elements 40. However, in some embodiments, an underfill may be disposed in the space between the semiconductor die 3 and the dielectric layer 20 (e.g. instead of, or in addition to, the encapsulant 44) to cover the copper pillars 38 and the connecting elements 40, and thus, the encapsulant 44 may contact the underfill.

During the molding operation, as shown in FIG. 17, the circuit layer 18 (e.g. 75% or more of the circuit layer 18, 90% or more of the circuit layer 18, 95% or more of the circuit layer 18, or substantially the entire circuit layer 18) is supported by the first metal layer 16. Thus, there will be substantially no empty space below the solder bump land pad 192 since the solder bump land pad 192 still contacts the conductive metal layer 14 of the first metal layer 16. The flow of the encapsulant 44 will not substantially influence the solder bump land pad 192, and the solder bump land pad 192 will not substantially deform. Therefore, the thickness and width of the circuit layer 18 can be reduced. As a result, the line width and a line space (L/S) of the circuit layer 18 can be reduced efficiently.

Figure 18:
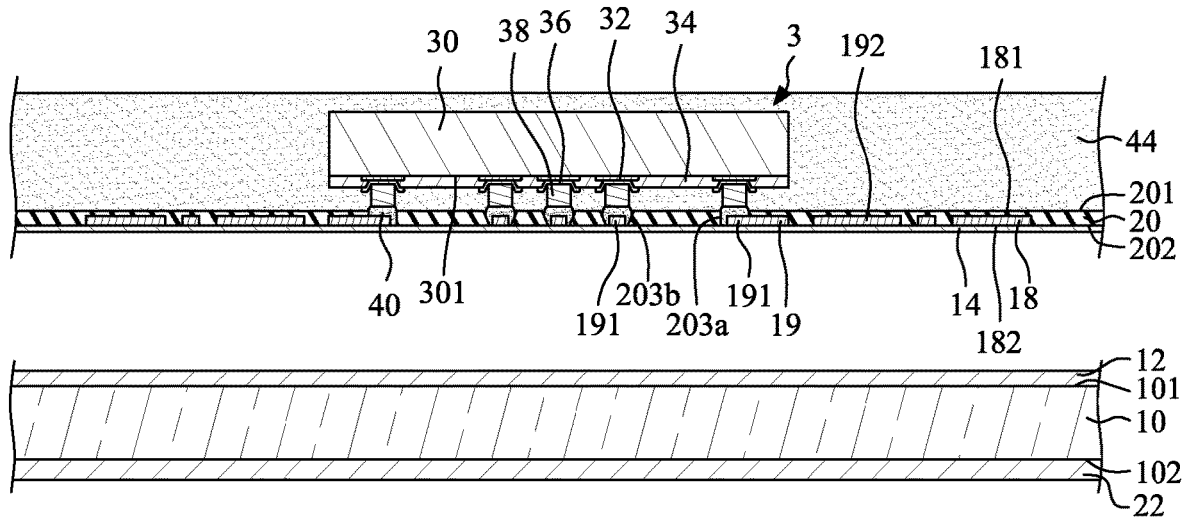
FIG. 18 illustrates one or more stages of some embodiments of a method for manufacturing a semiconductor package structure according to an aspect of the present disclosure.

Referring to FIG. 18, the carrier 10 and the base metal layer 12 are removed or separated from the conductive metal layer 14.

Figure 19:
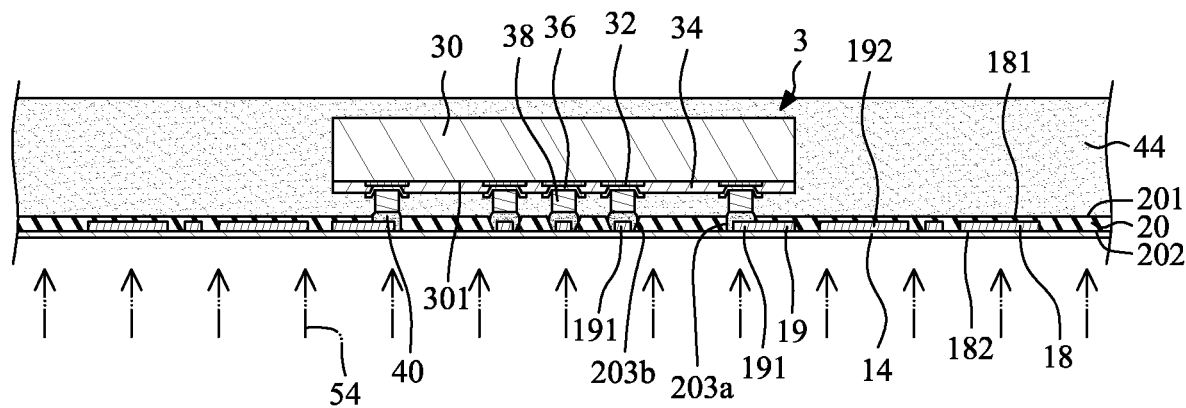
FIG. 19 illustrates one or more stages of some embodiments of a method for manufacturing a semiconductor package structure according to an aspect of the present disclosure.

Referring to FIG. 19, the conductive metal layer 14 of the first metal layer 16 is removed by for example, etching. That is, an etching agent 54 is applied to the conductive metal layer 14.

Figure 20:
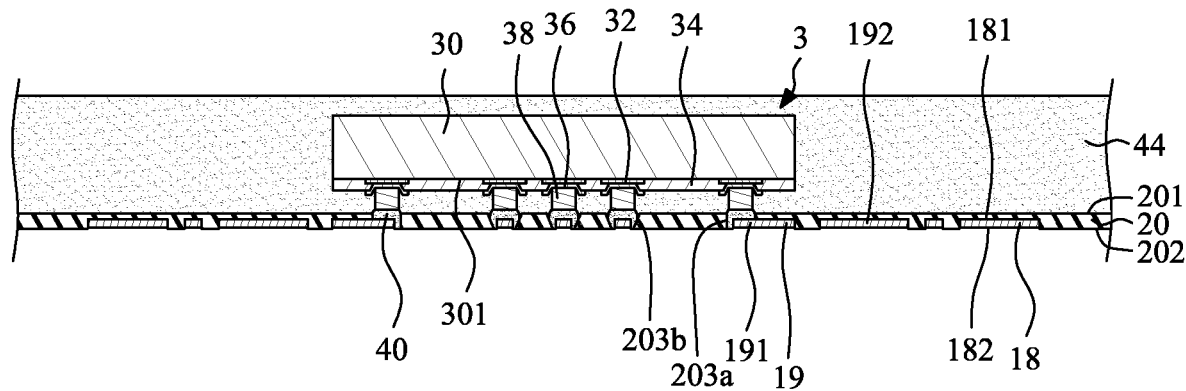
FIG. 20 illustrates one or more stages of some embodiments of a method for manufacturing a semiconductor package structure according to an aspect of the present disclosure.

Referring to FIG. 20, the second surface 182 of the circuit layer 18 is over-etched so that the second surface 182 of the circuit layer 18 is exposed and recessed from the second surface 202 of the dielectric layer 20 and the second surface 404 of the connecting element 40, as shown in FIG. 5 and FIG. 6. Meanwhile, the inner side surface 403 of the connecting element 40 is formed. The inner side surface 403 is disposed adjacent to the bottom corner of the trace 19 of the circuit layer 18.

Figure 21:
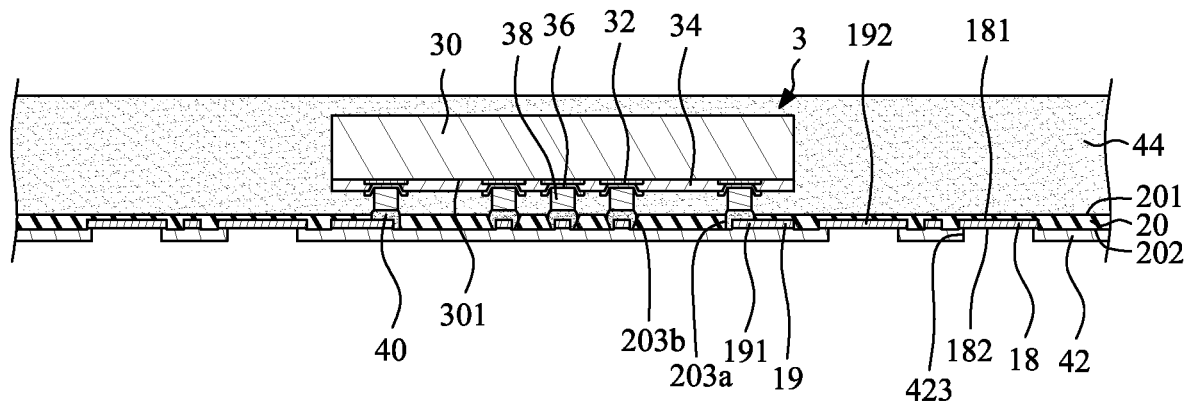
FIG. 21 illustrates one or more stages of some embodiments of a method for manufacturing a semiconductor package structure according to an aspect of the present disclosure.

Referring to FIG. 21, a protection layer 42 is formed on the second surface 202 of the dielectric layer 20 to cover a portion of the second surface 182 of the circuit layer 18. The protection layer 42 defines a plurality of openings 423 to expose portions (e.g., the solder bump land pad 192) of a second surface 182 of the circuit layer 18. A material of the protection layer 42 may be the same as or different from a material of the dielectric layer 20.

Then, a singulation process is conducted to form a plurality of semiconductor package structures 4 as shown in FIG. 4. In addition, a plurality of external connectors 46 (e.g., solder bumps) are respectively formed or disposed in a respective one of the opening 423 and on the exposed portion (e.g., the solder bump land pad 192) of the circuit layer 18 for external connection.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, no greater than 0.5 μm, or no greater than 0.1 μm. A surface can be deemed to be planar or substantially planar if a difference between a highest point and a lowest point of the surface is no greater than 5 μm, no greater than 2 μm, no greater than 1 μm, no greater than 0.5 μm, or no greater than 0.1 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   a carrier having a first surface and a second surface;
   a first metal layer disposed on the first surface of the carrier, wherein the first metal layer includes a base metal layer and a conductive metal layer, the base metal layer is disposed on the first surface of the carrier, and the conductive metal layer is disposed on the base metal layer;
   a circuit layer disposed on the conductive metal layer of the first metal layer; and
   a dielectric layer covering the circuit layer and defining a plurality of openings to expose portions of the circuit layer and portions of the first metal layer.

2. The substrate structure of claim 1, wherein a first surface of the circuit layer is recessed from a first surface of the dielectric layer.

3. The substrate structure of claim 1, wherein a surface roughness (Ra) of a second surface of the dielectric layer is greater than about 0.15 micrometers (μm).

4. The substrate structure of claim 1, wherein a thickness of the circuit layer is in a range of about 10 μm to about 15 μm, and a line width and a line space (L/S) of the circuit layer is in a range of about 5 μm/about 5 μm to about 12 μm/about 12 μm.

5. The substrate structure of claim 1, wherein a size of at least one opening of the plurality of openings of the dielectric layer is in a range of about 40 μm*about 40 μm to about 80 μm*about 80 μm.

6. The substrate structure of claim 1, further comprising a second metal layer disposed on the second surface of the carrier.

7. A semiconductor package structure, comprising:
   a circuit layer having a first surface and a second surface;
   a dielectric layer covering the first surface of the circuit layer and having a first surface and a second surface, wherein the dielectric layer defines an opening to expose a portion of the circuit layer, and the opening extends through the dielectric layer;
   a semiconductor die attached to the circuit layer by flip chip bonding;
   a connecting element electrically connecting the semiconductor die and the circuit layer, wherein at least a portion of the connecting element is disposed in the opening of the dielectric layer and is exposed from the second surface of the dielectric layer; and
   a protection layer disposed on the second surface of the dielectric layer to cover the circuit layer, wherein the protection layer defines a plurality of openings to expose portions of the second surface of the circuit layer.

8. The semiconductor package structure of claim 7, wherein the second surface of the circuit layer is exposed from the second surface of the dielectric layer, and the circuit layer does not protrude from the second surface of the dielectric layer.

9. The semiconductor package structure of claim 7, wherein a material of the connecting element includes tin, a bottom portion of the connecting element is exposed from the second surface of the dielectric layer, and the bottom portion of the connecting element includes an intermetallic compound (IMC).

10. The semiconductor package structure of claim 9, wherein the IMC includes a combination of copper and tin.

11. The semiconductor package structure of claim 7, wherein a surface of the connecting element is coplanar with the second surface of the dielectric layer, and the second surface of the circuit layer is recessed from the second surface of the dielectric layer.

12. The semiconductor package structure of claim 7, wherein a surface roughness (Ra) of a surface of the connecting element is greater than a surface roughness (Ra) of the second surface of the circuit layer.

13. The semiconductor package structure of claim 7, wherein the protection layer contacts an inner side surface of the connecting element.

14. The semiconductor package structure of claim 7, wherein a material of the protection layer is the same as a material of the dielectric layer.

15. The semiconductor package structure of claim 7, further comprising an encapsulant covering the semiconductor die and the dielectric layer.

16. The semiconductor package structure of claim 7, wherein a surface roughness (Ra) of the second surface of the dielectric layer is greater than about 0.15 μm.

17. The semiconductor package structure of claim 7, wherein the circuit layer consists of a single layer.

18. The semiconductor package structure of claim 17, wherein the circuit layer includes a solder bump land pad, and the semiconductor package structure further comprises an external connector connected to the solder bump land pad.

* * * * *